US010627430B2

(12) United States Patent
Mukherjee et al.

(10) Patent No.: US 10,627,430 B2
(45) Date of Patent: Apr. 21, 2020

(54) FAST CURRENT-BASED ENVELOPE DETECTOR

(71) Applicant: Texas Instruments Incorporated, Dallas, TX (US)

(72) Inventors: Subhashish Mukherjee, Bangalore (IN); Anoop Narayan Bhat, Karnataka (IN)

(*) Notice: Subject to any disclaimer, the term of this patent is extended or adjusted under 35 U.S.C. 154(b) by 6 days.

(21) Appl. No.: 15/163,380

(22) Filed: May 24, 2016

(65) Prior Publication Data

US 2017/0343589 A1 Nov. 30, 2017

(51) Int. Cl.
*G01R 19/04* (2006.01)
*H03D 1/22* (2006.01)

(52) U.S. Cl.
CPC ............. *G01R 19/04* (2013.01); *H03D 1/229* (2013.01); *H03D 1/2272* (2013.01)

(58) Field of Classification Search
CPC .................. G01R 19/04; H03F 2200/102; H03K 5/1532; H04L 27/06; H04N 5/4446
See application file for complete search history.

(56) References Cited

U.S. PATENT DOCUMENTS

| 4,890,066 A * | 12/1989 | Straver ............... H03D 1/06 329/369 |
| 6,137,101 A * | 10/2000 | Yokogawa ........... H04B 10/114 250/214 AG |
| 9,362,895 B2 * | 6/2016 | Seth ...................... H03K 3/012 |
| 9,601,995 B1 * | 3/2017 | Mukherjee ......... H03K 3/02337 |
| 2004/0166826 A1 * | 8/2004 | Chaoui ................. G01R 19/04 455/333 |
| 2004/0214536 A1 * | 10/2004 | Chien ................... G01R 19/04 455/127.2 |
| 2011/0050285 A1 * | 3/2011 | Su ......................... G01R 19/04 327/58 |
| 2012/0032736 A1 * | 2/2012 | Han ....................... H04L 27/12 329/300 |
| 2013/0082682 A1 * | 4/2013 | Horvath ........... G01R 19/16528 324/103 R |
| 2014/0085007 A1 * | 3/2014 | Hadji-Abdolhamid ................. H03F 3/19 330/297 |
| 2015/0136857 A1 * | 5/2015 | Pillin ................. G06K 19/0713 235/492 |

* cited by examiner

*Primary Examiner* — Akm Zakaria
(74) *Attorney, Agent, or Firm* — Ebby Abraham; Charles A. Brill; Frank D. Cimino

(57) ABSTRACT

A reduced-stage feedback-based envelope detector includes, for example, an input rectifier for rectifying a received modulated input signal and an amplifier for receiving the rectified modulated input signal at an input node. The amplifier compares the rectified modulated input signal with a reference signal, filters the rectified modulated input signal at the input node, and generates an envelope detection signal in response to the comparison and the filtering of the rectified modulated input signal. In an embodiment, the gain of the amplifier is independently determined from the bandwidth of the amplifier.

7 Claims, 9 Drawing Sheets

FAST CURRENT-BASED ENVELOPE DETECTOR

BACKGROUND

Many applications of electronic circuits include integrated circuits that operate using power supplies having a ground voltage that is different from the ground voltages of other integrated circuits. When the ground voltages differ, various kinds of communication couplers are used to permit coupling of information while maintaining direct current (DC) electrical isolation. The communication couplers include various kinds of couplers such as opto-couplers and digital isolators (where capacitive and inductive digital isolators are becoming more frequently chosen rather than opto-isolators). The communication between the two isolated sides coupled through a digital isolator is often accomplished using carrier-based modulation scheme such as "on-off keying" (OOK). In such systems, radio frequency (RF) detectors typically have high static current consumption, which often results in high system power dissipation. However, such circuits are often unsuitable for many battery-powered, high-speed applications due to increasingly greater data rates and the accompanying increase of currents used to power the high-speed communication couplers.

SUMMARY

The problems noted above can be addressed in a reduced-stage feedback-based envelope detector that includes, for example, an input rectifier for rectifying a received modulated input signal and an amplifier for receiving the rectified modulated input signal at an input node. The amplifier compares the rectified modulated input signal with a reference signal, filters the rectified modulated input signal at the input node, and generates an envelope detection signal in response to the comparison and the filtering of the rectified modulated input signal. In an embodiment, the gain of the amplifier is independently determined from the bandwidth of the amplifier.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . " Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion. The term "input" can mean either a source or a drain (or even a control input such as a gate where context indicates) of a PMOS (positive-type metal oxide semiconductor) or NMOS (negative-type metal oxide semiconductor) transistor. The term "mode" can mean a particular architecture, configuration (including electronically configured configurations), arrangement, application, and the like, for accomplishing a purpose. The term "processor" can mean a circuit for processing, a state machine and the like for execution of programed instructions for transforming the processor into a special-purpose machine, circuit resources used for the processing, and combinations thereof. The term "radio frequency" can mean any frequency that can be transmitted and received electromagnetically across a wireless medium.

Figure 1:
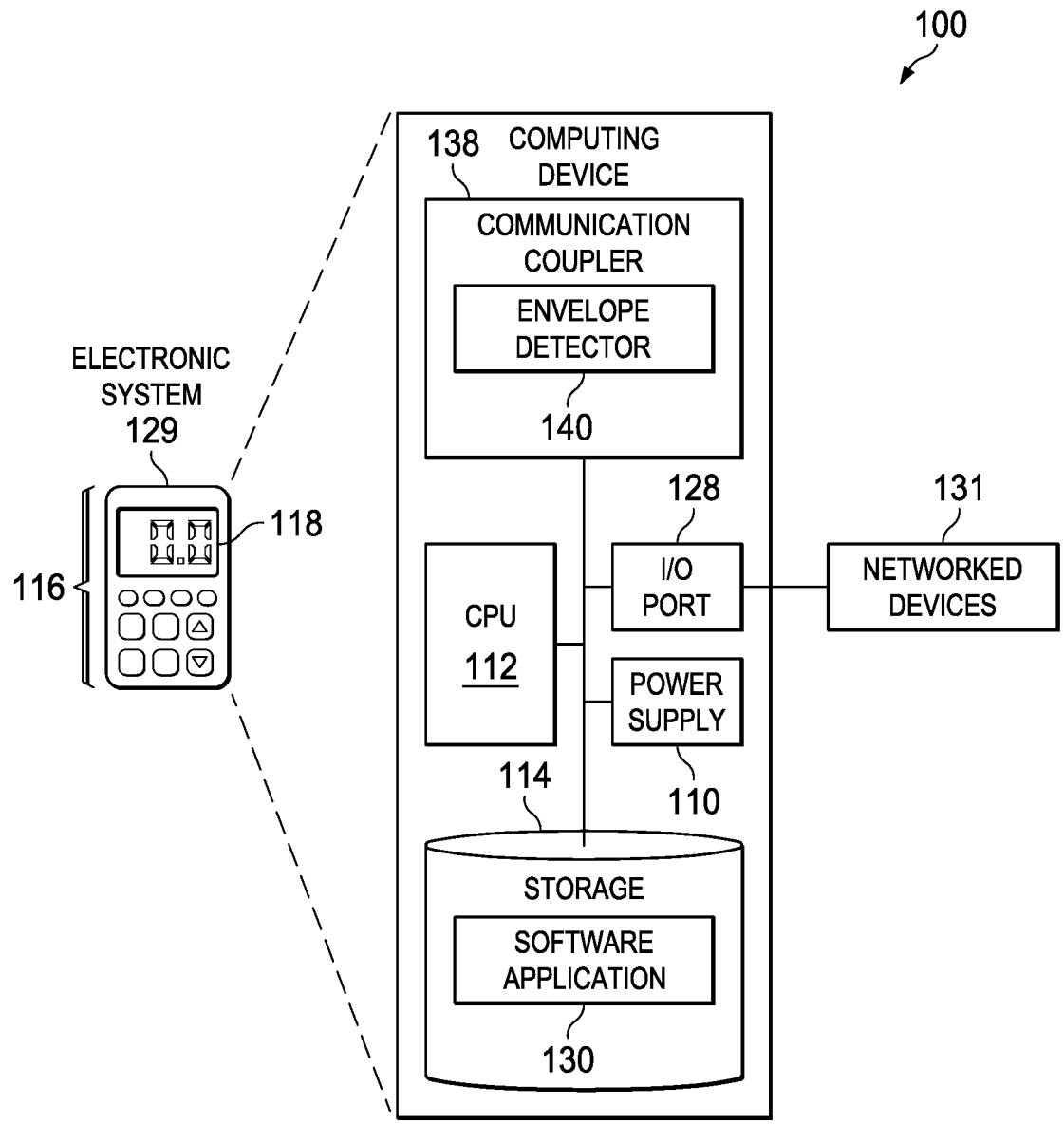
FIG. 1 shows an illustrative computing system 100 in accordance with certain embodiments of the disclosure.

FIG. 1 shows an illustrative computing system 100 in accordance with certain embodiments of the disclosure. For example, the computing system 100 is, or is incorporated into, an electronic system 129, such as a computer, electronics control "box" or display, communications equipment (including transmitters), or any other type of electronic system arranged to generate electrical signals.

In some embodiments, the computing system 100 comprises a megacell or a system-on-chip (SoC) which includes control logic such as a CPU 112 (Central Processing Unit), a storage 114 (e.g., random access memory (RAM)) and a power supply 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores instructions for one or more software applications 130 (e.g., embedded applications) that, when executed by the CPU 112, perform any suitable function associated with the computing system 100.

The CPU 112 comprises memory and logic circuits that store information frequently accessed from the storage 114. The computing system 100 is often controlled by a user using a UI (user interface) 116, which provides output to and receives input from the user during the execution the software application 130. The output is provided using the display 118, indicator lights, a speaker, vibrations, and the like. The input is received using audio and/or video inputs (using, for example, voice or image recognition), and electrical and/or mechanical devices such as keypads, switches, proximity detectors (including sensors), gyros, accelerometers, and the like. The CPU 112 is coupled to I/O (Input-Output) port 128, which provides an interface operable to receive input from (and/or provide output to) networked devices 131. The networked devices 131 can include any device capable of point-to-point and/or networked communications with the computing system 100. The computing system 100 can also be coupled to peripherals and/or computing devices, including tangible, non-transitory media (such as flash memory) and/or cabled or wireless media. These and other input and output devices are selectively coupled to the computing system 100 by external devices using wireless or cabled connections. The storage 114 can be accessed by, for example, by the networked devices 131.

The CPU 112 is coupled to I/O (Input-Output) port 128, which provides an interface operable to receive input from (and/or provide output to) peripherals and/or computing devices 131, including tangible (e.g., "non-transitory") media (such as flash memory) and/or cabled or wireless media (such as a Joint Test Action Group (JTAG) interface). These and other input and output devices are selectively coupled to the computing system 100 by external devices using or cabled connections. The CPU 112, storage 114, and power supply 110 can be coupled to an external power supply (not shown) or coupled to a local power source (such as a battery, solar cell, alternator, inductive field, fuel cell, charged capacitor, and the like).

The computing system 100 includes a communication coupler 138 for blocking direct current of a received (e.g., information) signal. As discussed below, the communication coupler 138 typically includes an envelope detector 140 for converting burst transmissions having a high frequency carrier signal into digital quantities. In an embodiment, the communication coupler 138 couples (e.g., capacitively or inductively) the burst transmissions from a primary to a secondary, where a power (e.g., voltage) loss in received signal in the secondary is typically encountered due to inefficiencies of the coupling. The envelope detector 140 is for determining the envelope of received signal in the secondary such that information in provide output to) peripherals and/or computing devices 131, including tangible (e.g., "non-transitory") media (such as flash memory) and/or cabled or wireless media (such as a Joint Test Action Group (JTAG) interface). These and other input and output devices are selectively coupled to the computing system 100 by external devices using or cabled connections. The CPU 112, storage 114, and power supply 110 can be coupled to an external power supply (not shown) or coupled to a local power source (such as a battery, solar cell, alternator, inductive field, fuel cell, charged capacitor, and the like).

The computing system 100 includes a communication coupler 138 for blocking direct current of a received (e.g., information) signal. The communication coupler 138 includes an envelope detector 140 operable to achieve higher data rates while still consuming lesser amounts of power. As discussed below with reference to FIG. 9, information carried by the received signal can be extracted and detected in accordance with an indication provided by an envelope detection signal.

Figure 2:
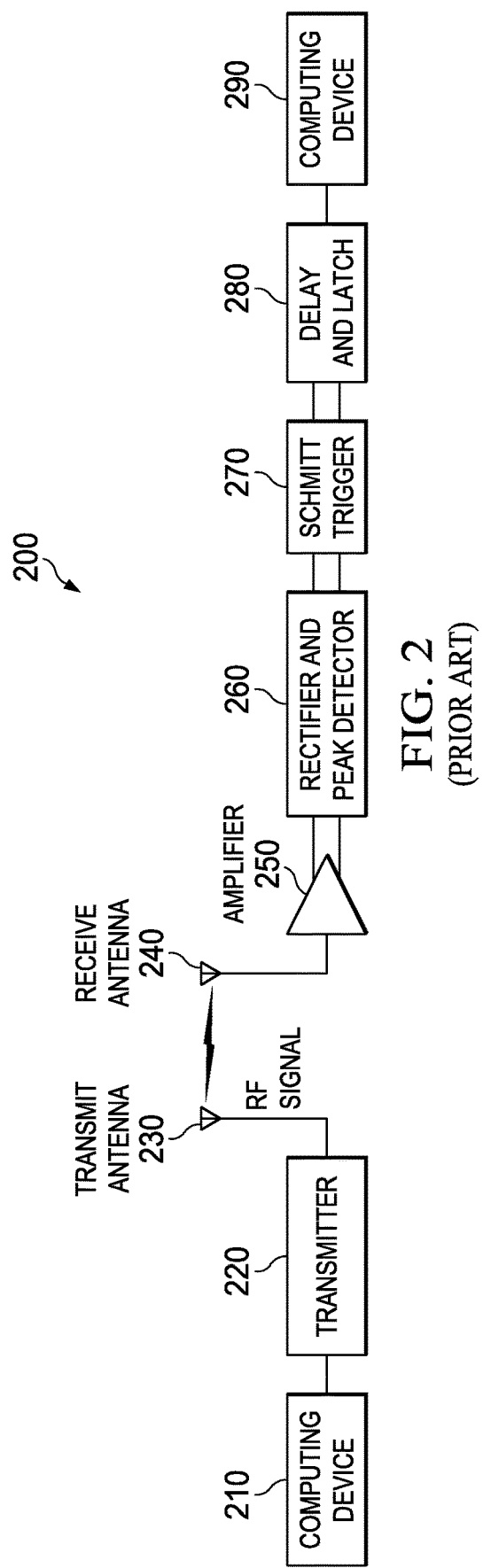
FIG. 2 is a block diagram of an example digital isolator system 200.

FIG. 2 is a block diagram of an example digital isolator system 200. The digital isolator system 200 includes a computing device 210 and a computing device 290. In operation, the computing device 210 is arranged to transmit digital information to be received by the computing device 290.

The computing device 210 is operable to send digital information to the transmitter 220. Transmitter 220 modulates the RF carrier according to the received digital information and, in response, transmits the modulated data (e.g., via the modulated carrier signal) through transmit antenna 230.

The modulated data transmitted via the transmit antenna 230 is propagated via electromagnetic radiation. The receive antenna 240 is operable to receive the corresponding modulated signal. The power level of the received propagated signal at receive antenna 240 is substantially attenuated below the power level of the signal used to generate the electromagnetic field (e.g., at the transmit antenna 230). The amplifier 250 is arranged to amplify the received propagated signal for further processing (e.g., by downstream components 260, 270, and 280).

The rectifier and peak detector 260 is operable to convert the alternating current (AC) amplified, received propagated signal to a direct current (DC) isolated signal. The Schmitt trigger 270 is operable to convert the DC isolated signal from an analog value to a digital value. The delay latch buffer 280 is operable to "deglitch" (e.g., filter out erroneous transitions in) the digital signal where transitions in the signal exceed a bit rate expected for the digital information received from the computing device 210. The delay latch buffer 280 is operable to transmit the filtered digital isolated signal as signal "data out" such that the computing device 290 is coupled to the digital information transmitted by the computing device 210.

Figure 3:
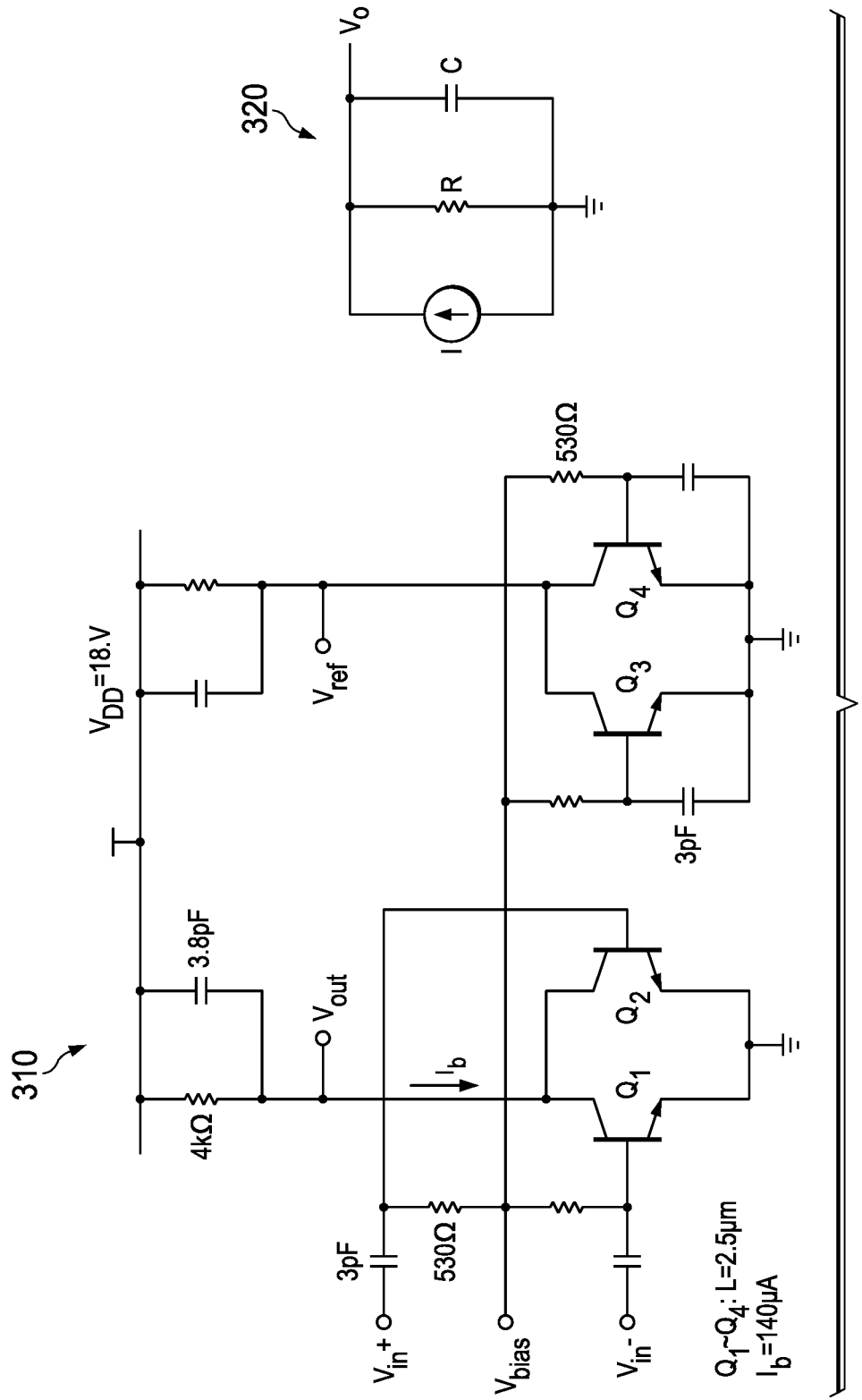
FIG. 3 is a schematic of a conventional power detector.

FIG. 3 is a schematic of a conventional power detector. Power detector 310 includes a differential RF signal input AC-coupled to the gates of transistors $Q_1$ and $Q_2$. The transistors $Q_1$ and $Q_2$ are biased (e.g., in an off-state) such that a reduced-DC current flows through the transistors $Q_1$ and $Q_2$, wherein the reduced-DC current is less than the average current of both $Q_1$ and $Q_2$ when there is an input signal. The transistors $Q_1$ and $Q_2$ are biased in the subthreshold region when no input signal is present and are operated in a square law region when there is a large signal input such that the higher order terms of Taylor's series cannot be neglected. When the input RF signal of either Q1 or Q2 is positive, a current flows through the respective transistor in accordance with the V-I characteristics of the transistor. When the input signal is negative, due to the sufficiently large input signal voltage, the respective transistor is assumed to be off such that zero current is assumed to be flowing through the respective transistor.

Accordingly, the combined current through $Q_1$ and $Q_2$ is a full wave rectified signal when a large signal differential sinusoidal RF voltage input is applied. The combined current carried by $Q_1$ and $Q_2$ is low-pass filtered by the parallel combination of the 530 Ohm resistor and the 3 pF capacitor. The bandwidth of the low-pass RC filter determines the maximum data rate of the RF input signal that can be detected in accordance with a given duty cycle requirement.

Transistors $Q_3$ and $Q_4$ are formed using similar design features (e.g., with respect to transistors $Q_1$ and $Q_2$) and coupled to a common bias voltage to generate a reference DC output voltage. The reference DC voltage and the output voltage ($V_{out}$) provide a differential output such that the differential voltage output is 0V (zero volts) when no (e.g., AC) input signal is present.

The 4 Kohm load resistor forms a first-order 10 MHz low-pass filter when combined the input capacitance of a next stage such that undesired harmonics in the output signal are filtered out. Filter 320 is a schematic of a first-order filter illustrating the combination of the load resistor with the capacitance of the next stage. The filter 320 operates in accordance with:

$$\frac{V_o}{I} = R\left(\frac{1}{1+sCR}\right) \quad (1)$$

where $V_o$ is $V_{out}$, I is the current $I_b$, R is the load resistor, C is the input capacitance of the next stage, and s is the Laplace transform complex variable.

Figure 4:
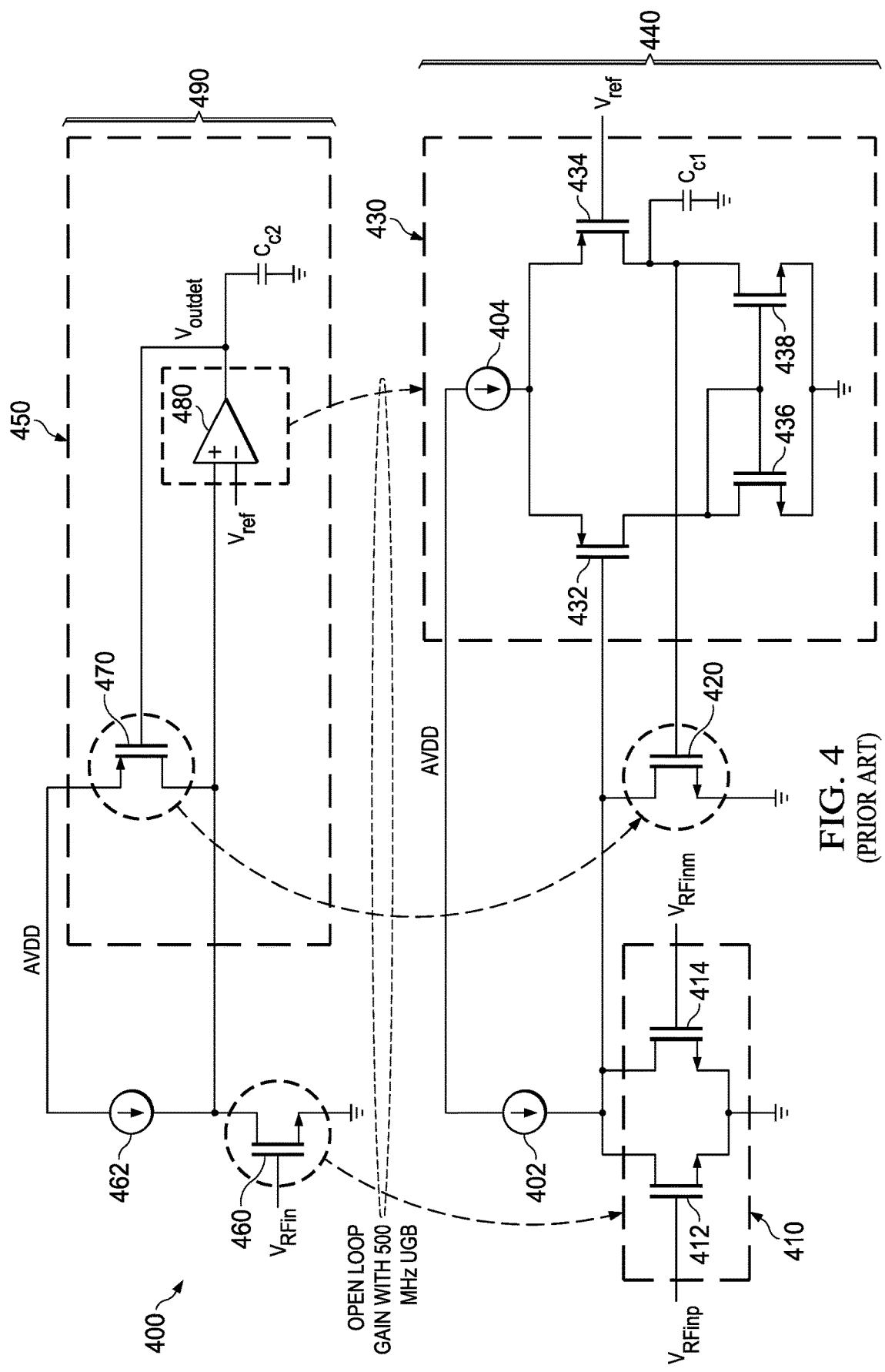
FIG. 4 is a schematic of a conventional RF envelope detector architecture.

FIG. 4 is a schematic of a conventional RF envelope detector architecture 400. Two-stage feedback-based envelope detector 490 includes, for example, a single-ended input half-wave rectifier and a two-stage feedback filter (where the single-ended input half-wave rectifier and a two-stage feedback filter are generally illustrated in the upper half of FIG. 4). Transistor 460 of the single-ended input half-wave rectifier is biased in a subthreshold region and is operable to convert the single-ended input voltage into a half-wave rectified current. The transistor 470 and the operational amplifier 480 (which together function as filter 450) are coupled in a feedback arrangement such that the half-wave rectified current is low-pass filtered.

In operation, a current source 462 of the single-ended input envelope detector 490 is coupled to the drain of the transistor 460 for biasing the transistor 460. The input RF voltage is converted by the transistor 460 into the half-wave rectified current as mentioned above. The voltage at the drain node of the transistor 460 is held to the reference voltage ($V_{ref}$) level by operation of the feedback filter including transistor 470 and operational amplifier 480. The drain voltage of transistor 460 is coupled to the non-inverting input of operational amplifier 480. The operational amplifier 480 compares the input drain voltage against the reference voltage ($V_{ref}$) and in response generates the RF envelope signal ($V_{outdet}$), which is coupled to the gate of transistor 470. Filter 450 (which includes the operational amplifier 480 and transistor 470) filters out harmonics in the half-wave rectified current and outputs the RF envelope signal ($V_{outdet}$). The low-frequency portion of the half-wave rectified current is supplied by the transistor 470 (after filtering) to hold the drain node of transistor 460 at the reference voltage $V_{ref}$. The compensation capacitor $C_{c2}$ coupled between the gate of the feedback transistor 470 and the output of operational amplifier 480 provides compensation capacitance for stability of operation.

The differential input envelope detector 440 includes an input stage 410 (including transistors 412 and 414), a feedback transistor (including transistor 420), and differential amplifier output stage 430 (including current source 404, PMOS transistors 432 and 434, and NMOS transistors 436 and 438). The feedback transistor 420 and the operational amplifier 480 are coupled in a feedback arrangement such that the half-wave rectified current is low-pass filtered.

In operation, the differential input envelope detector 440 (which includes components 410, 420, and 430) is similar to that of single-ended input envelope detector. The transistors 412 and 414 are biased in a subthreshold region and is operable to convert the single-ended input voltage into a half-wave rectified current.

The (e.g., idealized) operational amplifier 480 of the single-ended input envelope detector is realized as transistor-based, differential amplifier 430. The differential amplifier 430 compares the drain voltage of transistors 412 and 414 against a reference voltage ($V_{ref}$) to generate the output envelope detection signal ($V_{outdet}$) at (e.g., a node common to) the drains of transistors 434 and 438. Transistor 420 along with the differential amplifier 430 completes the feedback loop of the filter. The DC (current) drawn by two stage feedback filter of differential input envelope detector is around 600 microamps.

Capacitance $C_{c1}$ is required at the gate of the feedback transistor 420 for the compensation of 2-stage feedback structure. The capacitance $C_{c1}$ is a 1 pF compensation capacitor, which occupies a relatively large amount of layout space. Simulation results of the two-stage feedback-based envelope detectors 440 (for differential input envelope detectors) are described below with reference to FIG. 5. In the simulation discussed below, the 1 pF is used to achieve 45-degree phase margins over a 235 MHz bandwidth.

Figure 5:
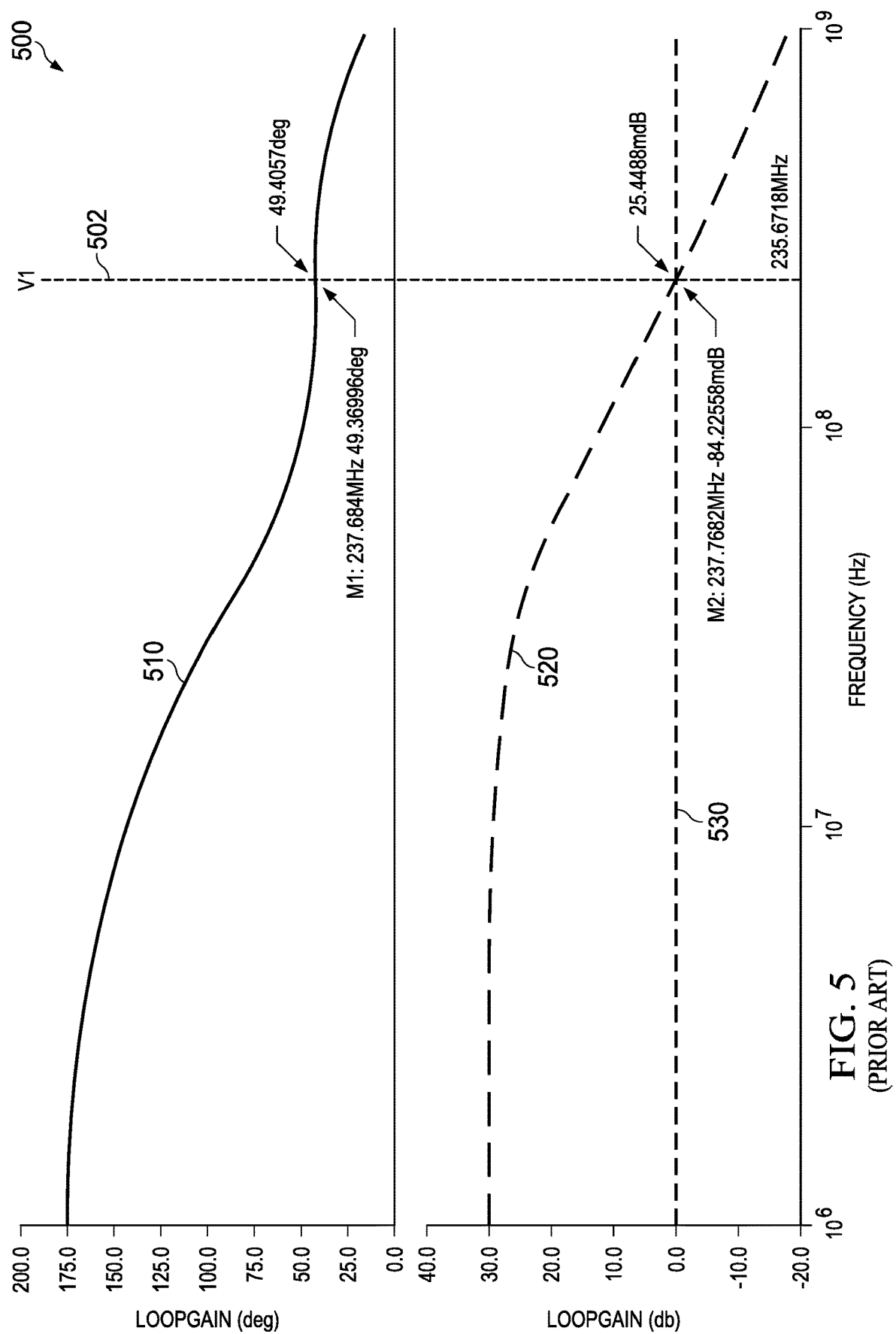
FIG. 5 is a waveform diagram illustrating simulation results of the two-stage feedback-based envelope detectors of FIG. 4.

FIG. 5 is a waveform diagram illustrating simulation results of the two-stage feedback-based envelope detectors of FIG. 4. The waveform diagram 500 includes waveforms 510, 520, and 530. The waveform 510 is a phase margin (e.g., loop gain) quantity of the output signal of (e.g., either of) the two-stage envelope detectors 440 or 490. The waveform of 510 is characterized by a phase shift of around 175 degrees at a frequency of 1 MHz. At the unity gain bandwidth of around 238 MHz, the waveform 510 has a value of around 49.4 degrees.

The waveform 520 is the envelope detection signal as discussed above with reference to FIG. 4. The waveform 520 is characterized by an amplitude (e.g., loop gain) of around 31 dB (deciBels) at a frequency of 1 MHz. At the unity gain bandwidth of around 238 MHz, the waveform 520 has a value of around 0 dB.

The waveform 530 is a reference value and is illustrates the amplitude (e.g., loop gain) of around 0 dB over the illustrated frequency range. The waveform 530 (e.g., 0 dB) intersects the waveform 520 at the unity gain bandwidth frequency 502 of around 238 MHz.

Figure 6:
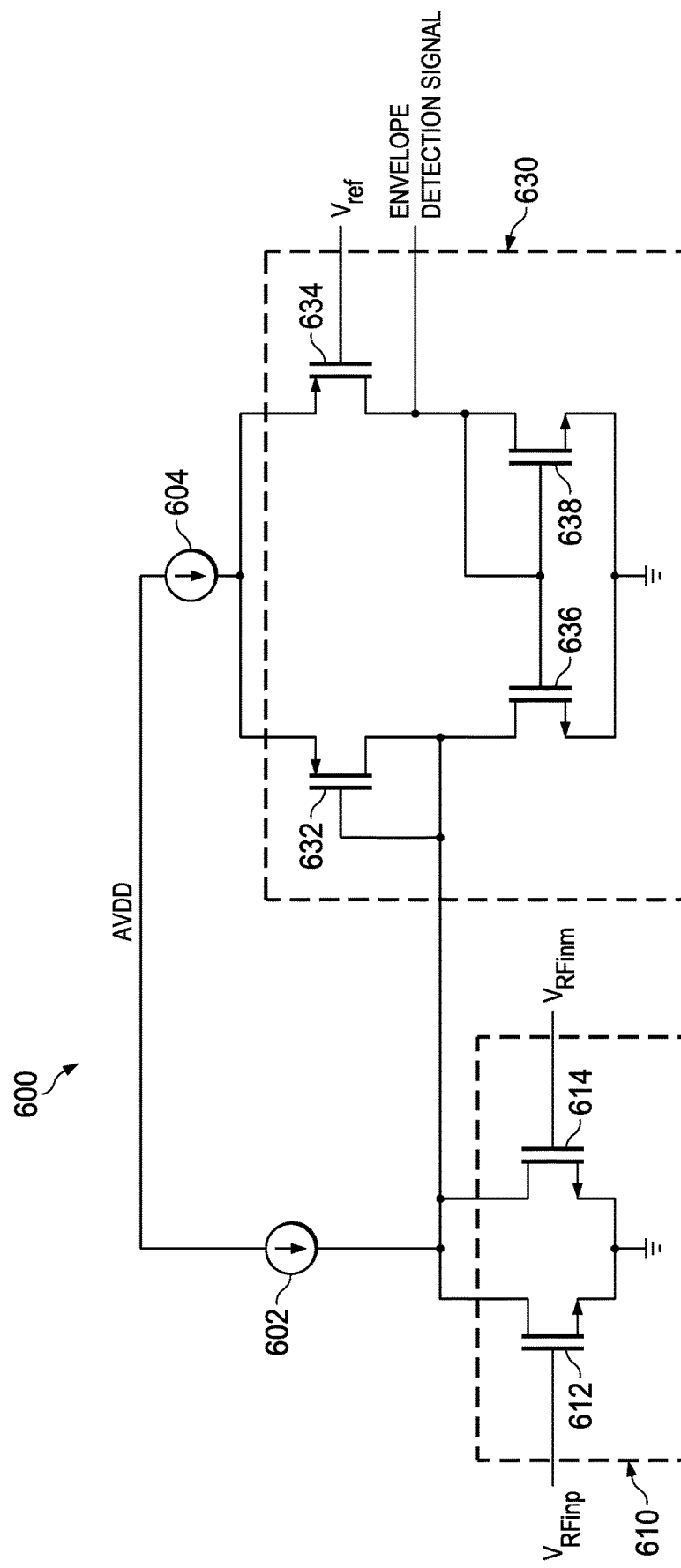
FIG. 6 is a schematic of a single-stage feedback-based envelope detector in accordance with embodiments of the present disclosure.

FIG. 6 is a schematic of a single-stage feedback-based envelope detector in accordance with embodiments of the present disclosure. Single-stage feedback-based envelope detector 600 includes, for example, a full-wave rectifier input stage 610 (including transistors 612 and 614) and a single-stage feedback-based output stage (including PMOS transistors 632 and 634, and NMOS transistors 636 and 638). The differential amplifier stage 630 is operable to receive (e.g., via the gate of transistor 632 such that the current therethrough is controlled in response) a rectified input signal from the full-wave rectifier input stage 610, to compare the input drain voltage of transistor 632 against the reference voltage ($V_{ref}$) to generate the envelope detection signal (V$_{outdet}$) between the drains of transistors 634 and 638, and to filter the rectified input signal (e.g., via the drain of the transistor 632).

In operation, a current source 602 of the differential input envelope detector 600 is coupled to the drains of the transistors 612 and 614 of the input stage 610. The input stage of 610 is operable to rectify (by operation of transistors 612 and 614 biased at subthreshold levels) the RF input signal voltage to a full-wave rectified output current. The resulting full-wave rectified current is sourced into the single-stage feedback-based filter 630 such that the single-stage feedback-based amplifier/filter 630 receives the rectified current from the input stage 610.

The drain voltage (e.g., of transistors 612 and 614) is coupled to the gate and drain of transistor 632 of the left-side input of the differential amplifier stage 630 such that transistor 632 is a diode-coupled (e.g., diode-connected) transistor. The gate of the transistor 634 is coupled to a reference voltage (V$_{ref}$). Current source 604 is coupled to both the sources of transistors 632 and 634 such that the total current sourced by the current sourced 604 is divided between the transistors 632 and 634 in accordance with the respective gate voltages. The drain of transistor 634 (e.g., at which the output voltage V$_{outdet}$ is generated) is coupled to a current mirror that includes transistors 638 and 636 such that the current gated by transistor 638 (and the current gated by transistor 634) develops a voltage for controlling the gate of transistor 636. The current mirror is operable to control respective currents received from the transistor 632 and the transistor 634 in response to a voltage developed at the drain of the transistor 634. The output voltage V$_{outdet}$ is an envelope detection signal that is generated and output at the drain of transistor 634 and is the low frequency node of the single-stage feedback-based filter 630. In order to maintain (e.g., by driving) the voltage at the drain of transistors 612 and 614 to V$_{ref}$ the low frequency portion of the full-wave rectified current supplied to transistors 612 and 614 by the RF input signal is supplied by the transistor 632 in accordance with the low-pass filtering of the single-stage feedback-based filter 630.

The single-stage feedback-based filter of the disclosed envelope detector 600 consumes around 200 microamps of current (e.g., as compared with the 600 microamps of the two-stage feedback-based envelope detector 400 architecture discussed above).

As disclosed herein, the single-stage feedback-based filter 600 includes a low frequency node at the gate/drain coupling (e.g., connection and/or feedback node), wherein the low frequency node is fed back to the input stage such that the input RF signal is low-pass filtered by a single stage (e.g., at the feedback node). Further, no compensation capacitor is required for feedback circuit initialization and stabilization because stability is achieved by the single-stage feedback structure of the single-stage feedback-based filter 600. The single-stage feedback structure saves layout space and cost and also improves the UGB (unity gain product). Simulation results of the single-stage feedback-based envelope detector 600 is described below with reference to FIG. 7. A mathematical model and block-level diagram of the envelope detector 600 is described below with reference to FIG. 8.

Figure 7:
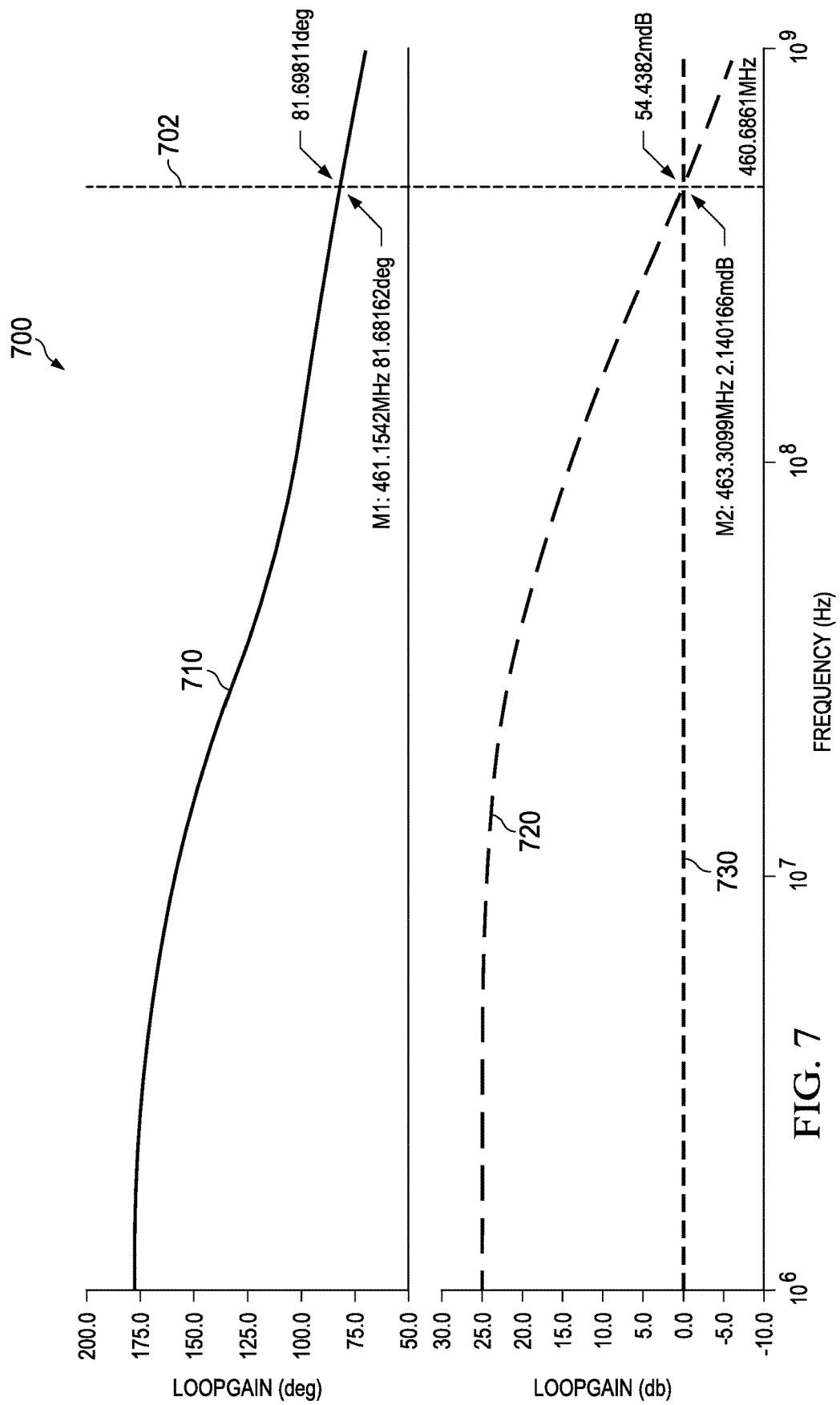
FIG. 7 is a waveform diagram illustrating simulation results of the single-stage feedback-based envelope detector of FIG. 6 in accordance with embodiments of the present disclosure.

FIG. 7 is a waveform diagram illustrating simulation results of the single-stage feedback-based envelope detector of FIG. 6. The waveform diagram 700 includes waveforms 710, 720, and 730. The waveform 710 is a phase margin (e.g., loop gain) quantity of the output signal of the two-stage envelope detector 600. The waveform of 710 is characterized by a phase shift of around 175 degrees at a frequency of 1 MHz. At the unity gain bandwidth of around 461 MHz, the waveform 710 has a value of around 81.7 degrees.

The waveform 720 is the envelope detection signal as discussed above with reference to FIG. 6. The waveform 720 is characterized by an amplitude (e.g., loop gain quantity) of around 25 dB at a frequency of 1 MHz. At the unity gain bandwidth of around 461 MHz, the waveform 720 has a value of around 0 dB.

The waveform 730 is a reference value and illustrates the amplitude (e.g., loop gain) of around 0 dB over the illustrated frequency ranges. The waveform 730 (e.g., 0 dB) intersects the waveform 720 at the unity gain bandwidth frequency 702 of around 461 MHz.

Figure 8:
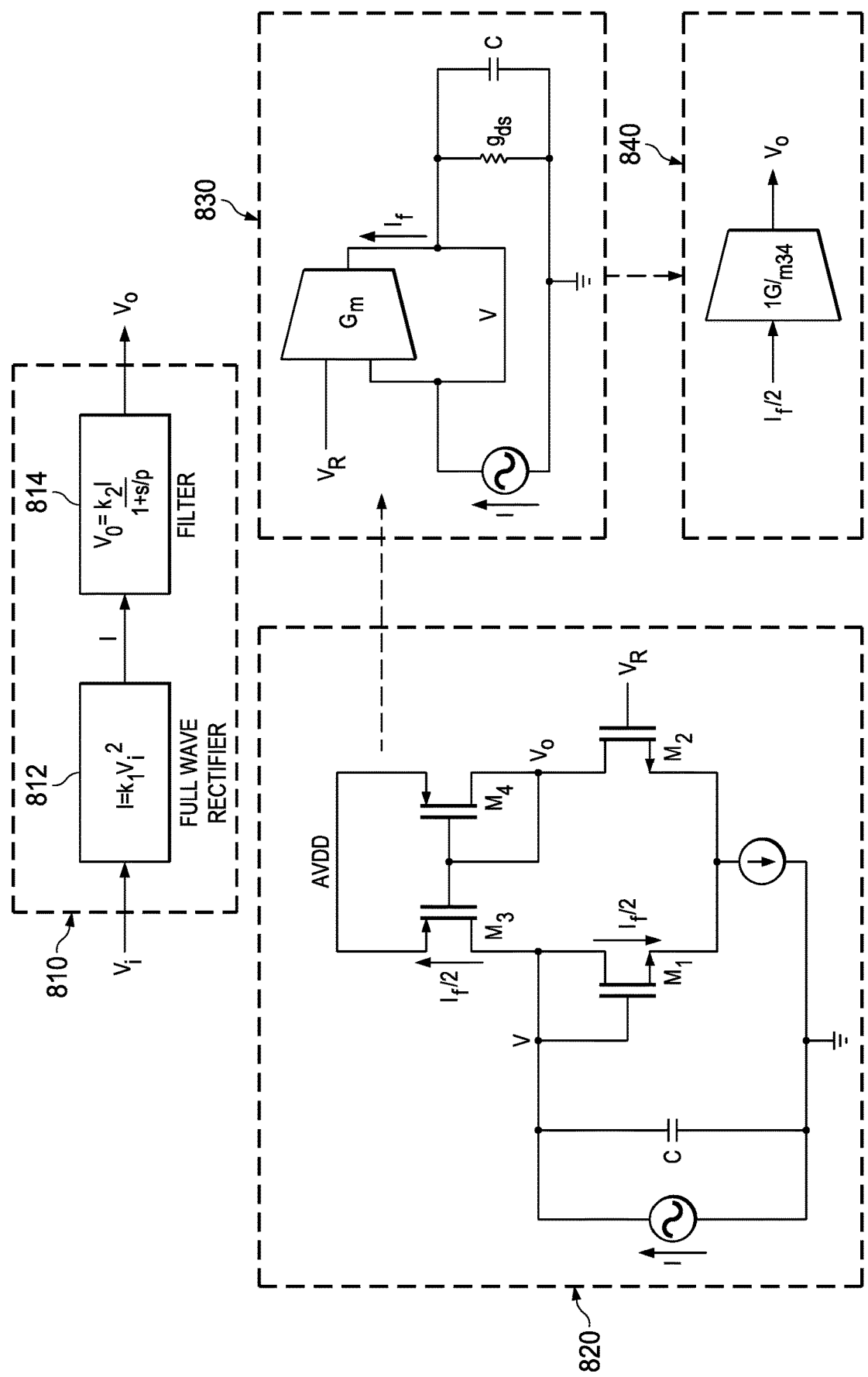
FIG. 8 illustrates a mathematical model and block-level diagrams of a single-stage feedback-based envelope detector in accordance with embodiments of the present disclosure.

FIG. 8 illustrates a mathematical model and block-level diagrams of a single-stage feedback-based envelope detector in accordance with embodiments of the present disclosure. Envelope detector 810 is an idealized representation of the envelope detector 600 (discussed above with reference to FIG. 6). The envelope detector 810 includes full-wave rectifier 812 and a filter 814. The full-wave rectifier 812 is functionally similar to the input stage 610 of the disclosed two-stage envelope detector 600.

For example, transistors 612 and 614 are biased in a subthreshold region and function as full-wave rectifiers. When input voltage swing is sufficiently large, square law operation of the transistor (e.g., where the input voltage is of sufficiently large voltage such that the higher order terms of the Taylor's series negligibly affects the operation of the circuit) can be assumed. The full-wave rectifier 812 operates in accordance with:

$$I = k_1 V_i^2; \ V_i > 0$$

$$I = 0; \ V_i < 0 \qquad (2)$$

where I is the output current of the input stage, V$_i$ is the large signal input voltage, and k$_1$ is the coefficient from transistor I-V characteristic.

The filter 814 is functionally similar to the differential amplifier stage 630 of the disclosed single-stage feedback-based envelope detector 600. The filter 814 operates in accordance with:

$$V_o = \frac{k_2 I}{1 + s/p} \qquad (3)$$

where V$_o$ is the output voltage, k$_2$ is the DC input current to output voltage gain of the filter, and p is the 3-dB pole representing the bandwidth of the filter.

Envelope detector 820 is similar in function to the disclosed envelope detector 600. However, the output current source I is substituted for the full-wave rectifier 610, and the nMOS input differential amplifier (formed by the disclosed arrangement of transistors M$_1$, M$_2$, M$_3$, and M$_4$) is substituted for the pMOS input differential amplifier 630. The capacitance C of envelope detector 820 represents the equivalent parasitic capacitance at the input node V at the drains of transistors M$_3$ and M$_1$.

In operation, the full wave rectified current containing the envelope signal and higher order harmonics of the RF input signal flows into the filter embodied as a single-stage feedback-based amplifier. The higher-order harmonics of the full-wave rectified current sourced by current source I are impeded by the (e.g., parasitic) capacitance C, which results in a low frequency portion of the represented RF signal envelope flowing into the filter (e.g. in accordance with current supplied by the diode-coupled transistor input of the differential amplifier). Ideally, half of the corresponding current ($I_f/2$) flows through $M_3$, and the remaining half is coupled through $M_1$. Conventional filters typically include the output node of the filter at the (e.g., left-hand side) drain node of an input transistor where, for example, the parasitic capacitor typically allows higher frequency RF components to be developed on the drain node of the input transistor when the output is derived therefrom (e.g., the left-hand side drain node, which is the output node of conventional filters). The voltage V at the (e.g., left-hand side) drain of $M_3$ of the disclosed filter of envelope detector 820 responds to higher order harmonics of the full-wave rectified current due to the capacitance C. As disclosed herein, the (e.g., right-hand side) output $V_o$ is a low-frequency filtered indication (e.g., version) of the RF signal envelope.

To illustrate the derivations of mathematical relations of the disclosed single-stage feedback-based envelope detector, envelope detector 830 is disclosed as an ideal representation of the envelope detector 820. The NMOS input differential amplifier of envelope detector 820 is idealized as the transconductance block $G_m$ of envelope detector 830, where the transconductance block $G_m$ of envelope detector operates in accordance with an output conductance $g_{ds}$. The voltage V developed at a feedback node where the transconductance block $G_m$ operates in response to the full-wave rectified current (e.g., input by current source I) flowing into the filter (e.g., embodied as transconductance block $G_m$) is:

$$\frac{I}{V} = G_{m12} + g_{dsnp} + sC \quad (4)$$

where $G_{m12}$ is the transconductance of transistors M1 and M2 (e.g., where $G_{m1} = G_{m2} = G_{m12}$), $g_{dsnp}$ is the sum of the small (e.g., relative to the comparatively larger signal input voltage to the rectifier) signal output conductances of transistors $M_1$ and $M_3$, and C is the input parasitic capacitance. Accordingly, feedback node conducting the rectified modulated input signal In similar manner to envelope detector 820, the low frequency portion of the RF signal envelope of the full-wave rectified current supplied by current source I flows through a feedback node (such that the feedback node conducts the rectified modulated input signal) into transconductance $G_m$. The transconductance $G_m$, here for example, is the transconductance of $M_1$ or $M_2$ (where $M_1$ or $M_2$ are typically formed using the same design parameters). Accordingly, the current $I_f/2$ can be expressed as:

$$\frac{I_f}{2} = \frac{G_{m12}I}{G_{m12} + g_{dsnp} + sC} \quad (5)$$

Equation (5) can be expressed in terms of output voltage $V_o$ as:

$$\frac{V_o}{I} = \frac{1}{G_{m34}}\left(\frac{1}{1 + \frac{sC}{G_{m12} + g_{dsnp}}}\right) \quad (6)$$

where $G_{m34}$ is the combined transconductance of transistors $M_3$ and $M_4$.

To more fully appreciate the versatile operation of the disclosed single-stage feedback-based envelope detector in accordance of the equations disclosed above, the limitations of conventional RF envelope detectors is now discussed. For example, the full-wave rectified current-to-output envelope detected voltage relationship is expressed by the equation (1). For a given parasitic capacitance C of the output node (where the capacitance includes and is distributed between the input of the next stage and output of the same stage), the gain of the detection signal V/I is directly proportional to R. However, the bandwidth of the conventional circuit (which determines the maximum data rate that can be handled by the envelope detector) is inversely proportional to R. Accordingly, the conventional art is unsuited for operation at both arbitrarily high data rates and with arbitrarily higher gain.

In contrast, the disclosed equation (6) indicates the input rectified current-to-output envelope detected voltage gain is determined by $G_{m34}$, and also indicates the bandwidth of the circuit for a given parasitic capacitance is determined by $G_{m12}$. Accordingly, the bandwidth and gain of the disclosed envelope detector 840 are controlled by the two individual (and functionally independent) parameters $G_{m12}$ and $G_{m34}$. In accordance with the disclosed equations, the bandwidth and gain of the disclosed envelope detectors can be increased arbitrarily by individually controlling $G_{m12}$ and $G_{m34}$.

Accordingly, the disclosed envelope detector (e.g., 820) "merges" two amplification stages used in conventional envelope detectors into the disclosed single-amplifier envelope detector without compromising functionality. The output of the disclosed single-amplifier envelope detector is the (e.g., non-traditional) low frequency node (e.g., the drain of transistor 634) of the single-stage feedback-based filter. Using the low frequency node generates a "clean" low frequency RF envelope signal as compared with the conventional output node of the filter.

The conventional envelope detector 400 (discussed above with respect to FIG. 4) includes a two-stage feedback-based filter. Because the filter of envelope detector 400 includes two high impedance output nodes at the drain of 434 and the drain of 420, relatively large amounts of current are required to properly drive the amplifier when operating at higher bandwidths. In contrast, the disclosed single-stage feedback-based amplifier includes a single high impedance node. Accordingly, the disclosed single-stage feedback-based envelope detector (e.g., 600) requires relatively small amounts of current when operating at the higher bandwidths (see FIG. 7, for example). The amplifier of the disclosed single-stage feedback-based envelope detector does not require compensation (which would otherwise entail a layout area-consuming compensation capacitor) because of the single-stage feedback-based structure. As illustrated in FIG. 7, the amplifier of the disclosed single-stage feedback-based envelope detector achieves an 81-degree phase margin and a 460 MHz bandwidth.

Figure 9:
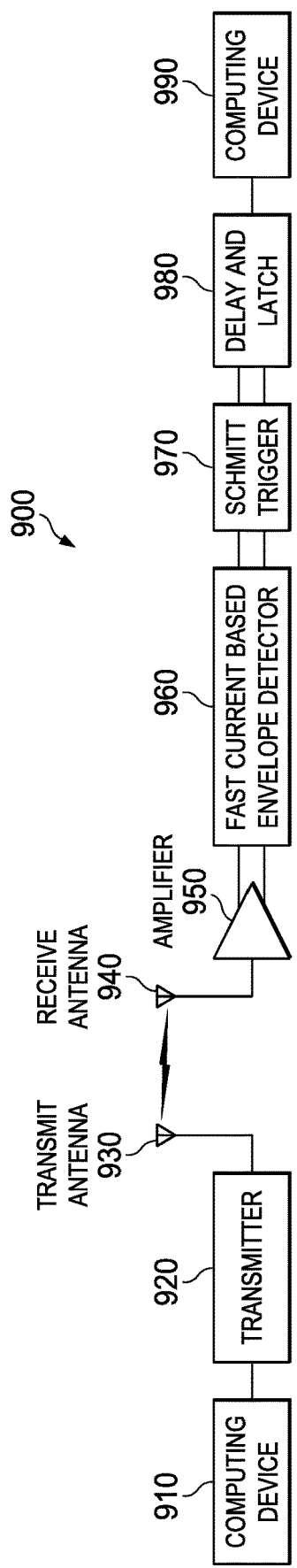
FIG. 9 is a block diagram of an example digital isolator system in accordance with embodiments of the present disclosure.

In accordance with the description of FIG. 9 below, the reduced power, the increased speed, and the reduced area of the disclosed envelope detector 820 are suitable for many RF applications such as high data rate transceivers, mobile handsets, high speed radar communication and the like. FIG. 9 is a block diagram of an example digital isolator system 900 in accordance with embodiments of the present disclosure. The digital isolator system 900 includes a sending device 910, and a computing device 990. In operation, the computing device 910 is arranged to transmit digital information to be received by the computing device 990. The sending device can be a remote control for waking up the computing device 990, for example.

The computing device 910 is operable to send digital information via a digital data waveform to the transmitter 920. Transmitter 220 modulates the RF carrier according to (for example) the input digital data waveform and transmits the modulated data (e.g., via the modulated carrier signal) through transmit antenna 930.

The modulated data transmitted via the transmit antenna 930 is propagated via electromagnetic radiation. The receive antenna 940 is operable to receive a portion of the transmitted electromagnetic radiation, which includes the corresponding modulated signal (albeit attenuated). The power level of the received propagated signal at receive antenna 940 is substantially attenuated below the power level of the signal used to generate the electromagnetic field (e.g., at the transmit antenna 930). The amplifier 950 is arranged to amplify the corresponding received modulated waveform for further processing (e.g., by downstream components 960, 970, and 980).

In accordance with the higher data rates of the disclosed stage feedback-based envelope detector (e.g., the radio frequency envelope detector 960) demodulation at higher digital data rates can be performed.

The radio frequency envelope detector 960 is operable to convert the alternating current (AC) amplifier, isolated signal to a direct current (DC) isolated signal. The Schmitt trigger 970 is operable to convert the DC isolated signal from an analog value to a digital value. The delay latch buffer 980 is operable to "deglitch" (e.g., filter out erroneous transitions in) the digital signal where transitions in the signal exceed a bit rate expected for the digital information received from the computing device 910. The delay latch buffer 980 is operable to transmit the filtered digital isolated signal as signal "data out" such that the computing device 990 is coupled to the digital information transmitted by the computing device 910. The signal "data out" is operable to provide an indication of information used to gate (e.g., modulate, turn on or off, shape, and the like) radio frequency portions of the input signal.

Figure 10:
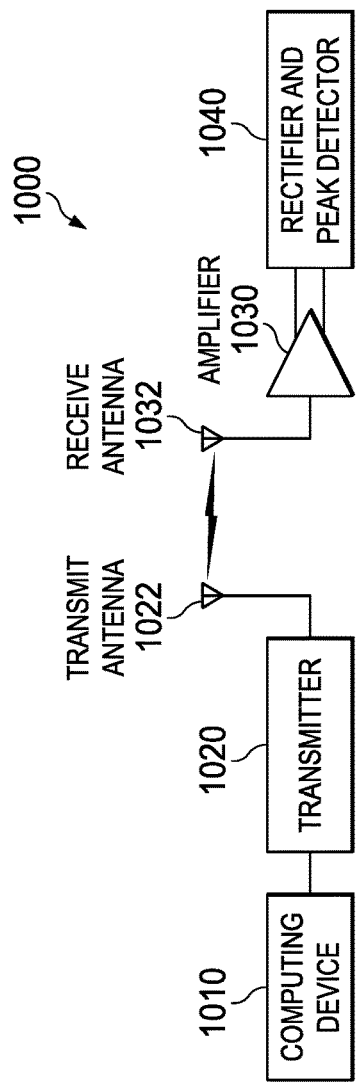
FIG. 10 is a block diagram of another example digital isolator system in accordance with embodiments of the present disclosure.

FIG. 10 is a block diagram of another example digital isolator system 1000 in accordance with embodiments of the present disclosure. The digital isolator system 1000 includes a sending device (which includes the computing device 1010, the transmitter 1020, and the transmit antenna 1022), for which proximity detection is desired (for example). In operation, the sending device 1010 is arranged to transmit an annunciator signal to be received by a proximity detection system (which, for example, includes the receive antenna 1032, the amplifier 1030, and the rectifier and peak detector 1040).

The computing device 1010 is operable (e.g., encode and) send an annunciator signal via a digital data waveform to the transmitter 1020. The transmitter 220 modulates the RF carrier according to the (e.g., encoded) annunciator signal and transmits the modulated data (e.g., via the modulated carrier signal) through transmit antenna 1030.

The modulated data transmitted via the transmit antenna 1022 is propagated via electromagnetic radiation. The receive antenna 1032 is operable to receive a portion of the transmitted electromagnetic radiation, which includes the corresponding modulated signal (albeit attenuated). The power level of the received propagated signal at receive antenna 1032 is substantially attenuated below the power level of the signal used to generate the electromagnetic field (e.g., at the transmit antenna 1030). The amplifier 1030 is arranged to amplify the corresponding received modulated waveform for further by the rectifier and peak detector 1940.

The rectifier and peak detector is operable to detect peaks of the amplified received propagated signal such that the annunciator signal (including, for example, identification data encoded in the signal for identifying the sending device) can be detected and decoded (when information is encoded on the RF carrier, for example).

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A circuit, comprising:
   an input rectifier having a first input, a second input, and an output, the input rectifier including:
   a first transistor having a first gate node and a first channel node, the first gate node is coupled to the first input; and
   a second transistor having a second gate node and a second channel node, the second gate node is coupled to the second input and the second channel node is coupled to the first channel node of the first transistor;
   a first current source having an output, the output of the first current source is coupled to the output of the input rectifier;
   a third transistor having a third gate node and a third channel node, the third gate node is coupled to the output of the input rectifier;
   a fourth transistor having a fourth channel node, the fourth channel node is coupled to the third channel node of the third transistor; and
   a second current source having an output, the output of the second current source is coupled to the third channel node of the third transistor and the fourth channel node of the fourth transistor.

2. The circuit of claim 1, wherein the fourth transistor has a second channel node and an envelope detection signal is generated at the second channel node of the fourth transistor.

3. The circuit of claim 1, comprising a fifth and sixth transistor, wherein the fifth and sixth transistor are coupled as a current mirror such that the fifth transistor is operable to receive current from the third transistor and the sixth transistor is operable to receive current from the fourth transistor.

4. The circuit of claim 3, wherein the current mirror is responsive to a drain voltage of the fourth transistor.

5. The circuit of claim 1, wherein the second current source is operable to source a fixed current coupled between the third and fourth transistors.

6. The circuit of claim 1, wherein the third transistor has a drain node, and a feedback node is coupled to the third gate node and the drain node of the third transistor.

7. The circuit of claim 1, wherein the input rectifier is a full-wave rectifier operable to generate an output current filtered in response to a feedback signal generated by the third transistor.

* * * * *